(12) United States Patent
Shiba et al.

(10) Patent No.: US 11,073,333 B2
(45) Date of Patent: Jul. 27, 2021

(54) SUBSTRATE TREATING APPARATUS AND EXHAUST METHOD THEREOF

(71) Applicant: SCREEN Holdings Co., Ltd., Kyoto (JP)

(72) Inventors: Yasuhiro Shiba, Kyoto (JP); Bingxi Liu, Kyoto (JP)

(73) Assignee: SCREEN Holdings Co., Ltd.

( * ) Notice: Subject to any disclaimer, the term of this patent is extended or adjusted under 35 U.S.C. 154(b) by 169 days.

(21) Appl. No.: 16/360,537

(22) Filed: Mar. 21, 2019

(65) Prior Publication Data

US 2019/0293353 A1 Sep. 26, 2019

(30) Foreign Application Priority Data

Mar. 23, 2018 (JP) .............................. JP2018-056648

(51) Int. Cl.
| | |
|---|---|
| F26B 25/00 | (2006.01) |
| F27B 17/00 | (2006.01) |
| C23C 16/46 | (2006.01) |
| H01L 21/67 | (2006.01) |

(52) U.S. Cl.
CPC .......... *F27B 17/0025* (2013.01); *C23C 16/46* (2013.01); *H01L 21/67109* (2013.01)

(58) Field of Classification Search
CPC .............................. B01D 53/00; F27D 17/001
See application file for complete search history.

(56) References Cited

U.S. PATENT DOCUMENTS

| | | | | |
|---|---|---|---|---|
| 7,802,986 | B2* | 9/2010 | Ooshima | H01L 21/67017 432/250 |
| 9,991,140 | B2* | 6/2018 | Mizuta | H01L 21/67017 |
| 10,256,122 | B2 | 4/2019 | Mizuta et al. | |
| 10,675,581 | B2* | 6/2020 | Khan | H01L 21/67017 |
| 2007/0074745 | A1* | 4/2007 | Kimura | H01L 21/67225 134/42 |

(Continued)

FOREIGN PATENT DOCUMENTS

| | | |
|---|---|---|
| JP | H09-296724 A | 11/1997 |
| JP | 2000-260680 A | 9/2000 |

(Continued)

OTHER PUBLICATIONS

Office Action and Search Report dated Apr. 6, 2020 for corresponding Taiwan Patent Application No. 108108425.

(Continued)

*Primary Examiner* — Gregory A Wilson
(74) *Attorney, Agent, or Firm* — Ostrolenk Faber LLP

(57) ABSTRACT

Disclosed is a substrate treating apparatus with a baking unit for heating a substrate to which a treating liquid that generates sublimate through heating is applied to bake a surface of the substrate to form a coat film. The apparatus includes the following elements: a first bake group, a second bake group, a first exhaust pipe that forms a flow path of exhaust gases from the first bake group with its end being in fluid communication with an exhaust gas processor that processes the exhaust gases, a second exhaust pipe that forms a flow path of exhaust gases from the second bake group, and a junction provided at a midstream of the first exhaust pipe and in fluid communication with a downstream side of the second exhaust pipe.

12 Claims, 5 Drawing Sheets

(56) References Cited

U.S. PATENT DOCUMENTS

2008/0008837 A1\* 1/2008 Shiba ................ H01L 21/67109
427/372.2

FOREIGN PATENT DOCUMENTS

| | | |
|---|---|---|
| JP | 2006-303414 A | 11/2006 |
| JP | 2008-212927 A | 9/2008 |
| JP | 4833005 B2 | 12/2011 |
| KR | 10-2007-0020623 A | 2/2007 |
| KR | 10-2017-0078185 A | 7/2017 |
| TW | 200845179 A | 11/2008 |
| TW | 201620010 A | 6/2016 |

OTHER PUBLICATIONS

Office Action and Search Report dated May 28, 2020 for corresponding Korea Patent Application No. 10-2019-0032272.
Notice of Allowance dated Oct. 21, 2020 for corresponding Korean Patent Application No. 10-2019-0032272.

\* cited by examiner

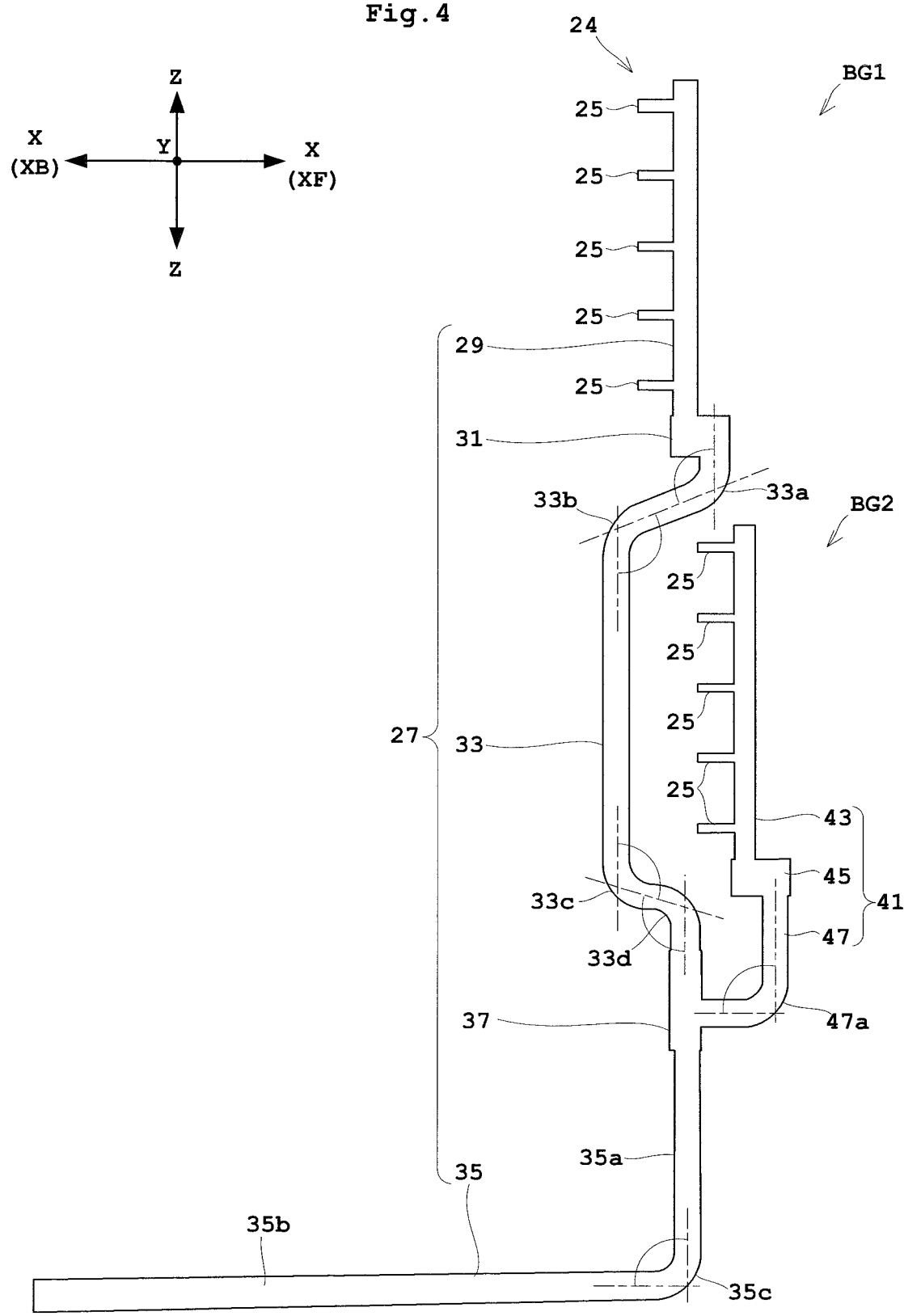

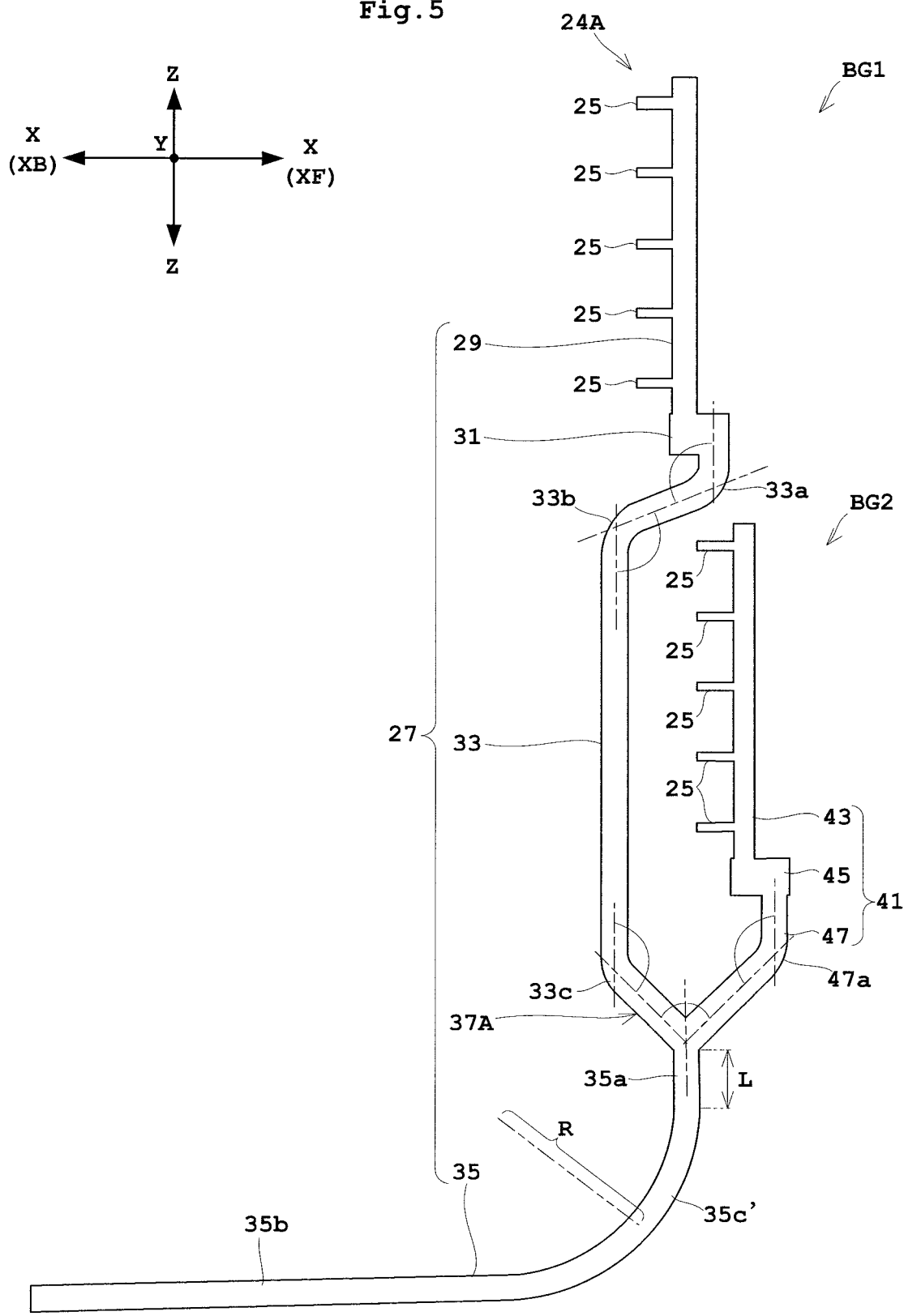

SUBSTRATE TREATING APPARATUS AND EXHAUST METHOD THEREOF

BACKGROUND OF THE INVENTION

1. Field of the Invention

The present invention relates to a substrate treating apparatus and an exhaust method that perform coat film formation to a semiconductor wafer, a substrate for liquid crystal display, a substrate for plasma display, a substrate for organic EL, a substrate for field emission display (FED), a substrate for optical display, a magnetic disk substrate, an optical magnetic disk substrate, a substrate for a photomask, and a solar cell substrate (hereinafter, simply referred to as a substrate.)

2. Description of the Related Art

In recent years, in order to support a microfabrication process, an underlayer film called a coating carbon film is formed on an underlayer of a photoresist film on a substrate, for example, and the underlayer film is used as an etching mask. Such a technique has been developed. When the underlayer film as above is formed, a substrate treating apparatus is used that is provided with a plurality of coating units and a plurality of baking units along with a transport device. Specifically, the coating units supply an underlayer film chemical to the substrate, and thereafter, the baking units perform a heat treatment to the substrate to bake the underlayer film on a surface of the substrate.

Typically, it takes a longer time for the baking units to perform the heat treatment of the underlayer film relative to the coating units. Accordingly, the number of baking units provided is larger than the number of the coating units. A plurality of, e.g., four baking units are multilayered vertically, and other four baking units are multilayered vertically at a position adjacent thereto in plan view. Alternatively, additional four baking units are occasionally multilayered below the four baking units depending on the number of coating units. Such a configuration is conceivable. When the four baking units are collected as one group, exhaust gases from the baking units are collected into every group. An exhaust pipe for every group extends in a longitudinal direction toward a lower part of the substrate treating apparatus, and extends in a horizontal direction. Then, the exhaust pipe is in fluid communication with an exhaust gas processing equipment in a factory. See, for example, Japanese Patent No. 4833005B.

However, the conventional example with such a configuration as above possesses the following drawbacks. Specifically, in the currently-used apparatus, exhaust gases containing sublimate flow through the exhaust pipe. Accordingly, when the temperature of the exhaust gases within the exhaust pipe is lowered, the sublimate is deposited in the exhaust pipe. When a large quantity of sublimate is deposited in the exhaust pipe, the exhaust pipe is clogged. This requires a maintenance for removing the sublimate. In addition, the maintenance is frequently required depending on the number of times of the heat treatment, leading to a drawback of lowered apparatus availability.

Then, the following two measures are conceivable: in order to suppress reduction in temperature of the exhaust gases to prevent deposition of the sublimate, a level surface of the exhaust pipe is formed by a jacketed pipe to take a thermal insulation measure (first measure); in order to discharge the exhaust gases before the temperature thereof is lowered, an internal diameter of the exhaust pipe is partially reduced to increase a flow speed of the exhaust gases (second measure). However, the first measure results in an inconvenience of increase in cost due to the jacketed pipe. The second measure limits reduction in diameter in order to obtain an increased flow speed of the exhaust gases with a maintained given flow speed. Therefore, it is not effective to make the flow speed too fast.

SUMMARY OF THE INVENTION

The present invention has been made regarding the state of the art noted above, and its one object is to provide a substrate treating apparatus and an exhaust method thereof that allow reduction in deposition of sublimate in an exhaust pipe to suppress lowered availability by suppressing reduction in temperature of the exhaust gases with reduced costs.

The present invention is constituted as stated below to achieve the above object. One aspect of the present invention provides a substrate treating apparatus with a baking unit for heating a substrate to which a treating liquid that generates sublimate through heating is applied to bake a surface of the substrate to form a coat film, the apparatus includes: a first bake group formed by multiplying the baking unit; a second bake group formed by multiplying the baking unit; a first exhaust pipe that forms a flow path of exhaust gases from the first bake group with its end being in fluid communication with an exhaust gas processor that processes the exhaust gases; a second exhaust pipe that forms a flow path of exhaust gases from the second bake group; and a junction provided at a midstream of the first exhaust pipe and in fluid communication with a downstream side of the second exhaust pipe.

[Effect] According to claim 1 of the present invention, the exhaust gases from the first bake group flows in the first exhaust pipe from the upstream side to the downstream side. At the junction on the midstream of the first exhaust pipe, the exhaust gases of the second bake group meet the exhaust gases from the second exhaust pipe, leading to suppressed reduction in temperature of the exhaust gases that flow in the first exhaust pipe. Accordingly, it is only necessary to provide the junction at the midstream of the first exhaust pipe, leading to suppressed reduction in temperature of the exhaust gases with suppressed costs. As a result, suppressed deposition of the sublimate in the first exhaust pipe and suppressed availability reduction is performable.

Moreover, it is preferred in the aspect of the present invention that the baking units forming the second bake group each perform treatment at a temperature higher than that in the baking unit of the first bake group.

The exhaust gases in the second bake group whose temperature is higher than the temperature of the exhaust gases in the first bake group meet at the junction. Accordingly, this achieves an increased temperature of the exhaust gases that is decreased to some extent through the first exhaust pipe.

Moreover, it is preferred in the aspect of the present invention that the second exhaust pipe is shorter than the first exhaust pipe.

A degree of decreasing the temperature of the exhaust gases from the second bake group before reaching the junction is smaller than a degree of decreasing the temperature of the exhaust gases from the first bake group that flows in the first exhaust pipe that is shorter than the second exhaust pipe. Consequently, the exhaust gases from the second bake group whose degree of temperature decrease is small meets at the junction, leading to more suppressed reduction in temperature of the exhaust gases that flow in the first exhaust pipe.

Moreover, it is preferred in the aspect of the present invention that, when the first exhaust pipe and the second exhaust pipe each include bent parts up to the junction, the bent parts each have an obtuse angle.

The exhaust gases in the first and second exhaust pipes are capable of flowing down to the junction smoothly. Accordingly, this allows suppressed reduction in temperature of the exhaust gases during flowing down in the first and second exhaust pipes.

Moreover, it is preferred in the aspect of the present invention that the first exhaust pipe includes at least partially thereof a first part that is directed upwardly/downwardly, and the junction is disposed at a midpoint of the first part of the first exhaust pipe directed upwardly/downwardly.

The exhaust gases that flow in the first exhaust pipe from the upstream to the downstream are capable of meeting the exhaust gases that flow in the second exhaust pipe smoothly at the junction.

Moreover, it is preferred in the aspect of the present invention that the first exhaust pipe and the second exhaust pipe are in fluid communication with the junction at an acute angle relative to a center line of the exhaust gas flow at the junction.

The exhaust gases in the first and second exhaust pipes are capable of flowing into the junction smoothly. Accordingly, this achieves smooth downstream flow of the exhaust gases from the junction, and thus suppressed reduction in temperature of the exhaust gases that flow down in the first exhaust pipe.

Moreover, it is also preferred in the aspect of the present invention that the first exhaust pipe includes a second part that extends transversely from the first part directed upwardly/downwardly at the downstream side of the first part, and a bent part of the second part that extends transversely from the first part directed upwardly/downwardly has a radius longer than the length in the longitudinal direction of the first exhaust pipe downstream of the junction.

The first exhaust pipe is capable of forming the radius of the bent part of the second part that extends transversely from the first part directed upwardly/downwardly. Accordingly, this achieves smooth flow of the exhaust gases, and thus suppressed reduction in temperature of the exhaust gases that flow down in the first exhaust pipe.

It is also preferred in the aspect of the present invention that the baking unit includes a hot plate that heats the substrate placed thereon, and a lid above the hot plate, and that the exhaust gases are collected with the lid.

The sublimate caused by heating the substrate moves upwardly to the above of the hot plate along with the hot exhaust gases. Accordingly, the lid above the hot plate is capable of collecting the sublimate effectively.

Another aspect of the present invention provides an exhaust method of a substrate treating apparatus with a baking unit for heating a substrate to which a treating liquid that generates sublimate through heating is applied to bake a surface of the substrate to form a coat film, the method includes the following steps: an exhausting step of meeting exhaust gases from a first bake group through a first exhaust pipe with exhaust gases from a second bake group through a second exhaust pipe at a junction formed at a midstream of the first exhaust pipe to discharge the exhaust gases to an exhaust gas processor that possesses the exhaust gases. The first bake group is formed by multiplying the bake unit in number to include a plurality of baking units. The second bake group is formed by multiplying the bake unit in number to include a plurality of baking units.

According to the other aspect of the present invention, the exhaust gases from the first exhaust pipe through the first bake group at the junction meet with the exhaust gases from the second bake group through the second exhaust pipe. Accordingly, it is only necessary to meet the exhaust gases in the two bake groups, leading to suppressed reduction in temperature of the exhaust gases with suppressed costs. As a result, suppressed deposition of the sublimate in the first exhaust pipe and suppressed availability reduction is performable.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 4 schematically illustrates the exhaust pipe.

FIG. 5 is one modification of the exhaust pipe.

DESCRIPTION OF THE PREFERRED EMBODIMENTS

Preferred examples of this invention will be described in detail hereinafter with reference to the drawings.

Figure 1:
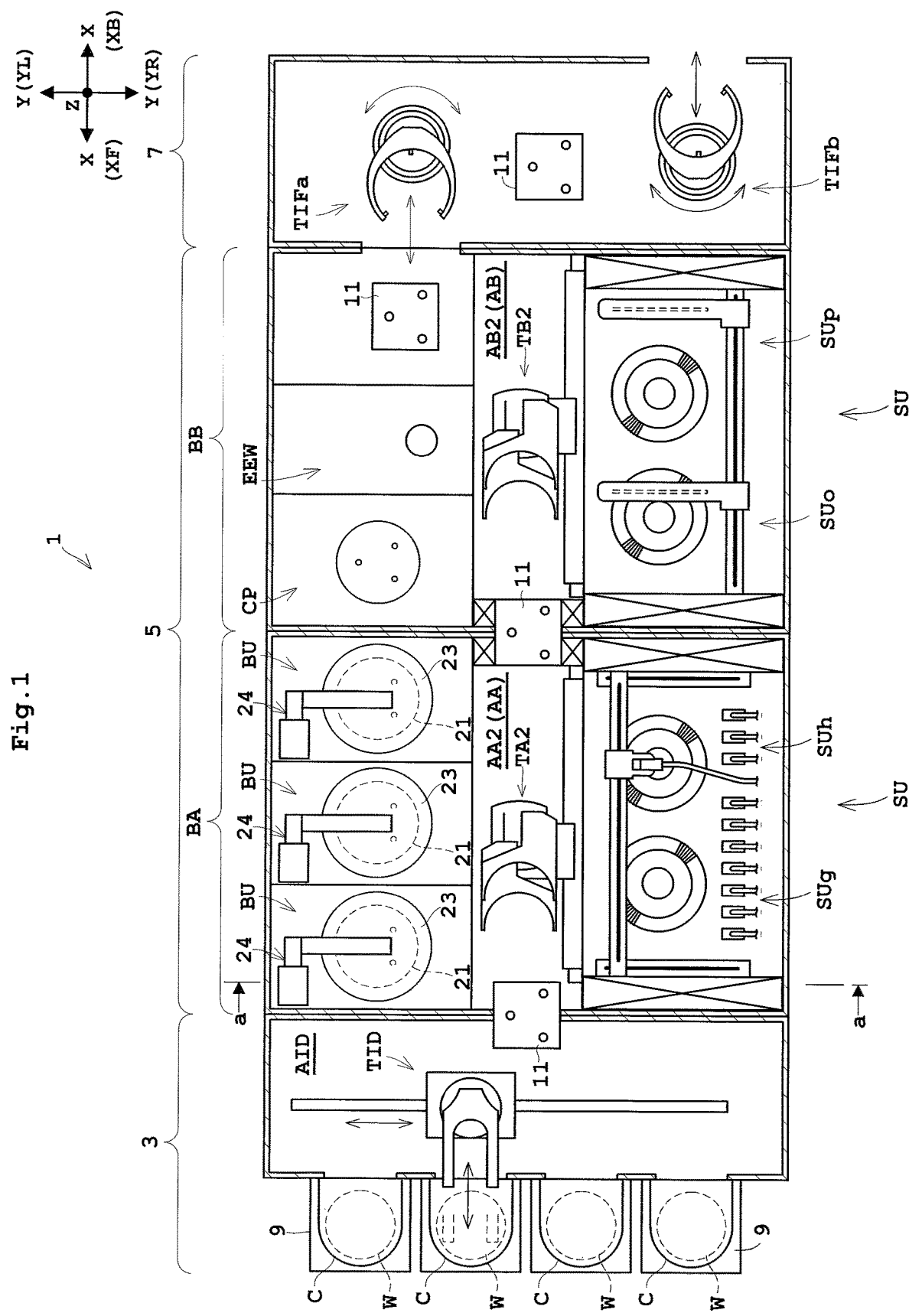
FIG. 1 is a plan view of a substrate treating apparatus according to one embodiment.
Figure 2:
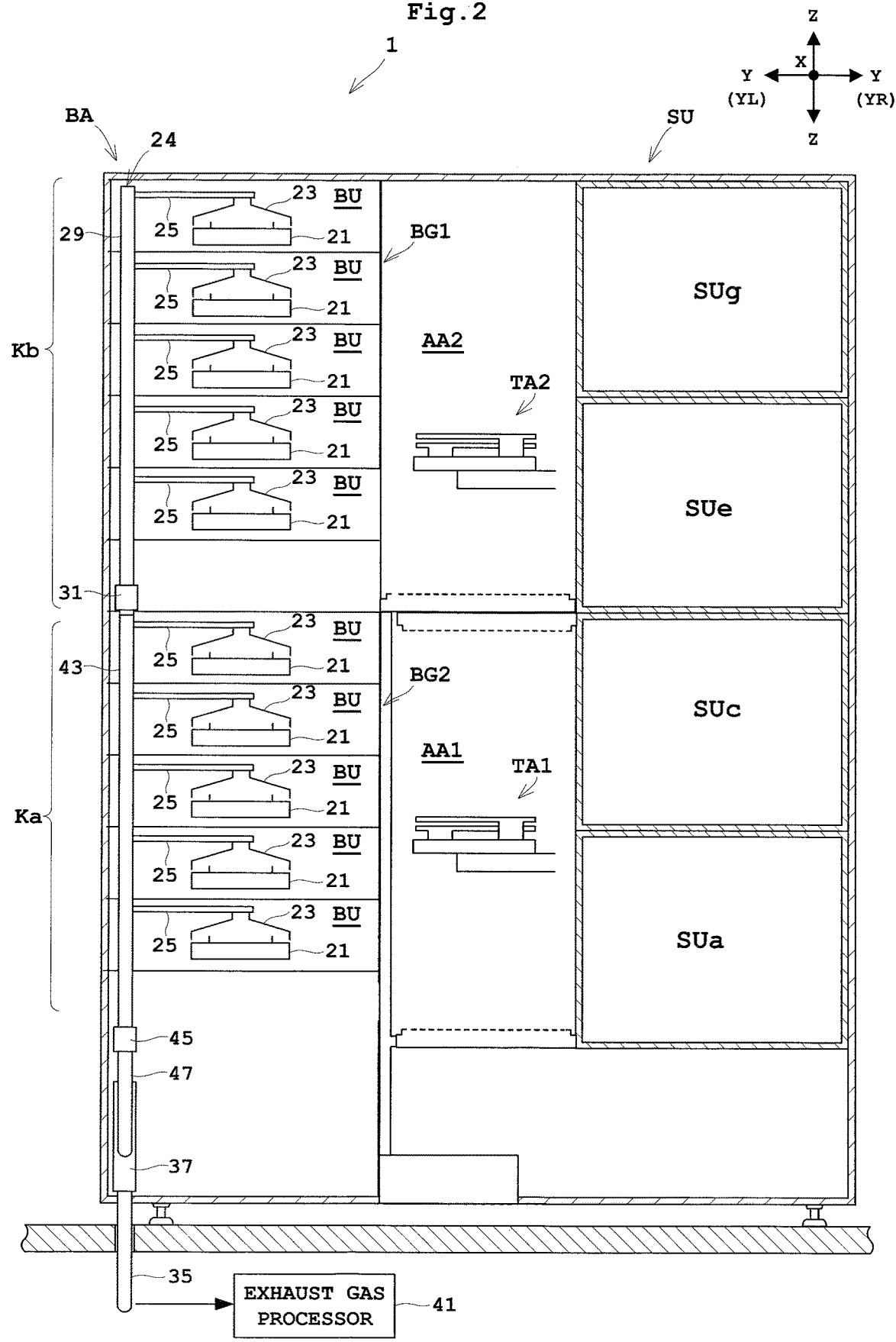
FIG. 2 is a side view seen from an arrow a-a of FIG. 1.

The following describes one embodiment of the present invention with reference to drawings. FIG. 1 is a plan view of a substrate treating apparatus according to one embodiment. FIG. 2 is a side view seen from the arrow a-a of FIG. 1.

The substrate treating apparatus 1 according to one embodiment includes an indexer 3, a processor 5, and an interface 7. The indexer 3 is connected to the processor 5, and supplies a substrate W as a processing object to the processor 5. The processor 5 supplies a processing liquid to the substrate W. Thereafter, the processor 5 heats and bakes the substrate W to form a coat film. The interface 7 is connected to the processor 5. The interface 7 is connected to an exposing machine, not shown, that is separated from the substrate treating apparatus 1. The interface 7 delivers the substrate W between the processor 5 and the exposing machine (not shown).

The indexer 3, the processor 5, and the interface 7 are configured to be disposed in line in this order.

In the following description, a direction where the indexer 3, the processor 5, and the interface 7 are disposed is referred to as a "forward/backward direction X". Specifically, a direction from the interface 7 to the indexer 3 is referred to as a "forward direction XF", whereas a direction opposite to the forward direction XF is referred to as a "backward direction XB". A direction orthogonal to the forward/backward direction X is referred to as a "width direction Y". Moreover, one side of the "width direction Y" is appropriately referred to as a "right direction YR", whereas a side opposite to the "right direction YR" is referred to as a "left direction YL". Moreover, a vertical direction is referred to as an "upward/downward direction Z". It should be noted that simple description such as "lateral" and "transverse" is not limited to any of the forward/backward direction X and the width direction Y.

The processor 5 includes two processing blocks BA, BB. The processing blocks BA, BB each perform coat film formation and various types of processing associated therewith to every substrate W. The processing blocks BA and BB are arranged side by side in the forward/backward direction X. The processing blocks BA and BB are connected so as to transport the substrate W to each other. The indexer 3 is connected to the processing block BA in the forward direction XF. The interface 7 is connected to the processing block BB in the backward direction XB.

The indexer 3 includes carrier mount tables 9, a transportation space AID, and an indexer transport mechanism TID.

Carriers C are placed on the carrier mount tables 9, respectively. The carriers C are placed by an external transport mechanism, not shown, onto the carrier mount tables 9. The carriers C each accommodate a plurality of substrates W. Examples of the carriers C include a FOUP (Front Opening Unified Pod).

The transportation space AID is disposed in the backward direction XB of the carrier mount tables 9. The transportation space AID includes the indexer transport mechanism TID provided thereon as a so-called transport robot. The indexer transport mechanism TID delivers the substrate W among the carriers C. Moreover, the indexer transport mechanism TID delivers the substrate W among the processor 5. In other words, the indexer transport mechanism TID accesses the carriers C and the processing block BA.

The processing block BA includes a transportation space AA for transporting the substrate W. The transportation space AA is disposed in the middle of the processing block BA in the width direction Y in plan view. The transportation space AA extends in the forward/backward direction X in plan view.

As illustrated in FIG. 2, the transportation space AA is divided into a plurality of transportation space sections AA1, AA2 that are arranged side by side in the upward/downward direction Z. The transportation space section AA1 is disposed below and the transportation space section AA2 is disposed on the transportation space section AA1.

The transportation space section AA1 includes a main transport mechanism TA1 disposed therein. The transportation space section AA2 includes a main transport mechanism TA2 disposed therein. The main transport mechanisms TA1, TA2 each transport the substrate W. The main transport mechanism TA1 merely moves within the transportation space sections AA1, and thus does not move to the other transportation space section AA2. Similarly, the main transport mechanism TA2 merely moves within the transportation space sections AA2, and thus does not move to the other transportation space section AA1.

A liquid processing unit SU includes a plurality of (e.g., eight) liquid processing units SUa to SUh. Note that FIG. 1 only illustrates liquid processing units SUg, SUh, and FIG. 2 only illustrates liquid processing units SUa, SUc of the liquid processing units SUa to SUh for an illustrative reason. The liquid processing units SUa to SUh are disposed on the right direction YR of the transportation space AA.

The liquid processing unit SU is disposed in a matrix array seen from the right direction YR. Specifically, the liquid processing units SUa, SUb are arranged side by side substantially horizontally. The liquid processing units SUc, SUd are arrange side by side substantially horizontally. The liquid processing units SUe, SUf are arrange side by side substantially horizontally. The liquid processing units SUa, SUc, SUe, SUg are disposed in this order from the below in the upward/downward direction Z. The liquid processing units SUb, SUd, SUf, SUh are disposed in this order from the below in the upward/downward direction Z. The liquid processing units SUa to SUd are disposed in the right direction YR of the transportation space section AA1, and the liquid processing units SUe to SUh are disposed in the right direction YR of the transportation space section AA2.

The liquid processing units SUa to SUh each perform liquid processing. The liquid processing is made, for example, by coating the substrate W with a processing liquid that generates sublimate upon heating, and applying a coat film to a surface of the substrate W. The film formed in such a manner is called as an underlayer film such as a carbon film. Moreover, a liquid processing is performed to the substrate W with the underlayer film formed thereon using a photoresist liquid as the processing liquid.

The processing block BA typically includes various heat treatment units that cool and heat the substrate W. Note that the following description is made under an assumption that the processing block BA includes only the baking units BU that heat the substrate W as the heat treatment unit for easy understanding of the invention. In addition, the processing block BA includes the baking units BU in a matrix array. However, only ones of them that are disposed in the upward/downward direction Z adjacent to the indexer 3 in the backward direction XB are to be described.

The baking units BU are disposed in the left direction YL in the transportation space AA. For instance, five baking units BU are laminated in the upward/downward direction Z to form a first bake group BG1. Moreover, for instance, five baking units BU are laminated below the first bake group BG1 in the upward/downward direction Z to form a second bake group BG2. Moreover, it is preferred that meeting the exhaust gases overcomes the inconvenience mentioned later. Accordingly, it is preferred that the baking units BU of the second bake group BG2 have the processing temperature equal to or higher than that of the baking units BU of the first bake group BG1.

Moreover, detailed description is made later of the baking units BU, the first bake group BG1, and the second bake group BG2.

The main transport mechanism TA1 transports the substrate W between the liquid processing unit SU and the second baking unit BU. The main transport mechanism TA2 transports the substrate W between the liquid processing units SUe to SUh and the first baking unit BU.

As is apparent from the above description, the processing block BA has a layered structure where a plurality of (e.g., two) layers Ka, Kb that are arranged in the upward/downward direction.

As illustrated in FIG. 1, the substrate treating apparatus 1 includes plates 11 on which the substrate W is placed. Specifically, the plates 11 are disposed between the indexer 3 and the processing block BA in plan view, and in the transportation space sections AA1, AA2, respectively, in side view. The indexer transport mechanism TID and the main transport mechanisms TA1, TA2 each deliver the substrate W with the plates 11.

As illustrated in FIG. 1, the processing block BB includes the transportation space AB. The transportation space AB is disposed in the middle of the processing block BB in the width direction Y in plan view. The transportation space AB is connected to the transportation space AA.

The transportation space AB is divided into a plurality of transportation space sections AB1 (not show) and transportation space sections AB2 that are arranged side by side in the upward/downward direction Z. The transportation space section AB1 (not shown) is disposed at the same level as that of the transportation space section AA. The transportation space section AB2 is disposed at the same level as that of the transportation space section AA2.

Similar to the processing block BA, the processing block BB includes a main transport mechanism TB1 (not shown) and a main transport mechanism TB2 in the upward/downward direction Z.

The plates 11 are disposed in the processing block BA and the processing block BB, respectively, in plan view, and are disposed in the transportation space sections AB1 (not shown), AB2, respectively in side view. The main transport mechanism TA1 and the main transport mechanism TB1 (not shown) deliver the substrate W with a lower one of the plates 11 (not shown). The main transport mechanism TA2 and the main transport mechanism TB2 deliver the substrate W with upper plates 11.

The processing block BB includes the liquid processing unit SU having the same arrangement as the processing block BA. The liquid processing unit SU of the processing block BB includes a plurality of (e.g., eight) liquid processing units SUi to SUp. Here FIG. 1 shows only liquid processing units SUo, SUp for an illustrative reason.

The liquid processing unit SU of the processing block BB includes a developing process unit that supplies a developer to the exposed substrate W.

The processing block BB includes a cooling unit CP, an edge exposing unit EEW, and the plates 11. The cooling unit CP cools the substrate W. The edge exposing unit EEW exposes only a peripheral edge of the substrate W. The plates 11 are disposed in the backward direction XB in the processing block BB, and is used for loading/unloading the substrate W to/from the interface 7.

The interface 7 includes interface transport mechanisms TIFa, TIFb. The plate 11 is disposed between the interface transport mechanisms TIFa, TIFb. The interface transport mechanism TIFa delivers the substrate W between the plate 11 of the processing block BB and the plate 11 of the interface 7. The interface transport mechanism TIFb delivers the substrate W between the plate 11 of the interface 7 and the exposing machine not shown.

The substrate treating apparatus 1 configured in such a manner as above performs the following processing as under. Firstly, the indexer transport mechanism TID unloads the substrate W from the carrier C, and the main transport mechanism TA2 transports the substrate W to the liquid processing unit SU. In the liquid processing unit SU, a processing liquid for underlayer film formation is applied to the substrate W. Then, the main transport mechanism TA2 transports the substrate W to the baking unit BU where a heat treatment (e.g., at 300) is performed. This achieves bake of the underlayer film on the substrate W. During the heat treatment, sublimate is generated. The sublimate is exhausted along with a treatment atmosphere of the baking unit BU. Then, the cooling plate, not shown, of the processing block BA cools the substrate W, and thereafter the liquid processing unit SU supplies the photoresist. Then, the main transport mechanism TA2 transports the substrate W to the baking unit BU of the processing block BA where a heat treatment (e.g., at 120° C.) is performed. The main transport mechanism TA2 delivers the substrate W via the plate 11 to the main transport mechanism TB2. The main transport mechanism TB2 delivers the substrate W via the plate 11 of the processing block BB to the interface 7. Thereafter, the exposing machine, not shown, exposes the substrate W. The exposed substrate W is transported via the interface 7 to the liquid processing unit SU of the processing block BB where the developing process is performed. Then, the substrate W is transported to the processing block BA where a heat treatment is performed. Thereafter, the main transport mechanism TA1 and the indexer 3 accommodates the substrate W into the carrier C.

Figure 3:
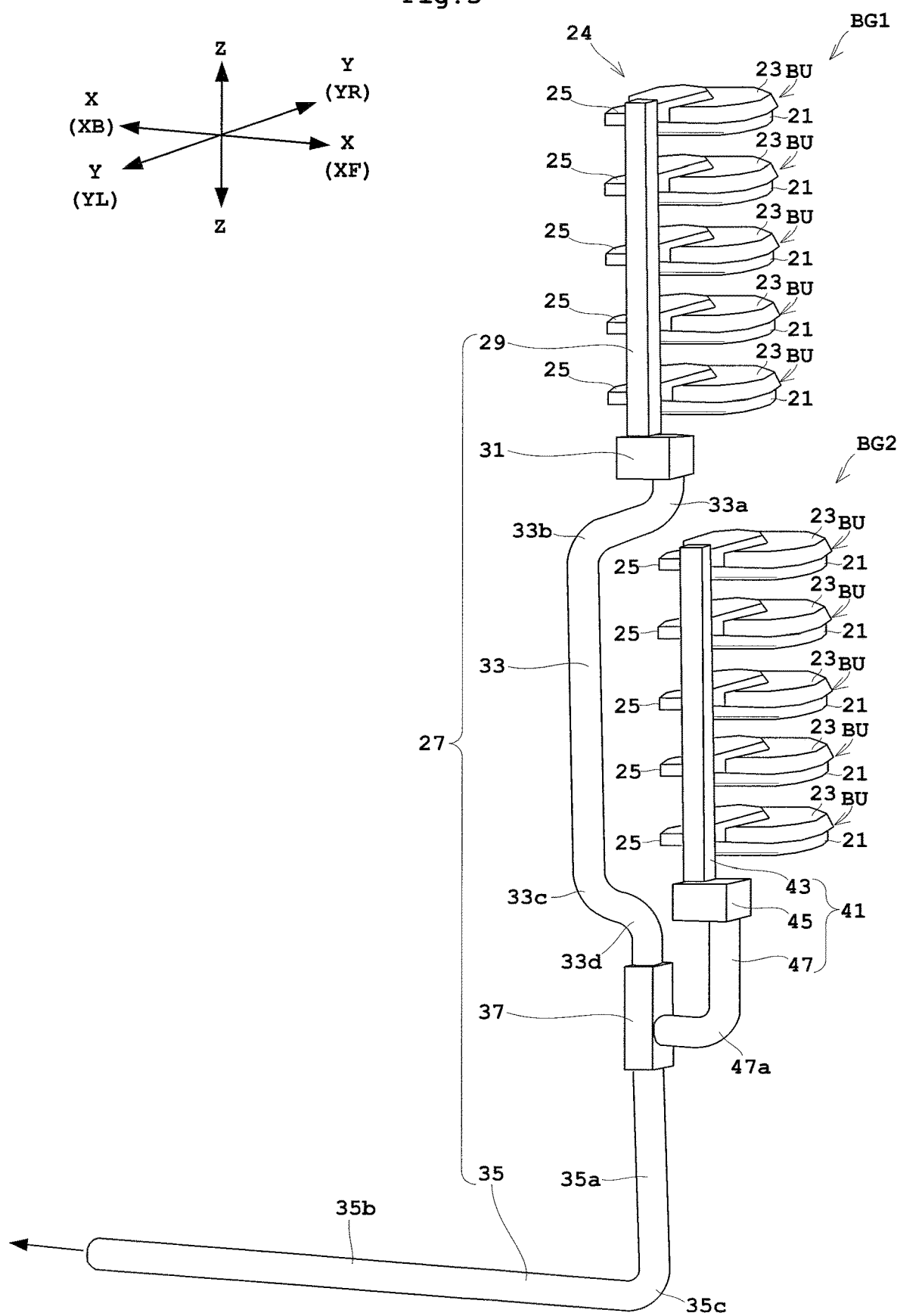
FIG. 3 is a perspective view of a baking unit and an exhaust pipe.

Detailed description is now made about the baking units BU that forms the processing block BA with reference to FIGS. 3 and 4. FIG. 3 is a perspective view of baking units and an exhaust pipe. FIG. 4 schematically illustrates the exhaust pipe. Note that FIG. 4 merely illustrates tubes, and omits the other elements.

The baking unit BU includes a hot plate 21, a lid 23, and an exhaust pipe 24. The hot plate 21 includes three lift pins, for example, not shown. The lift pins moves downwardly, whereby the substrate W is placed on a top face of the hot plate 21. The hot plate 21 includes a heating device such as a heater, not shown, embedded therein. The heating device is operated to heat the placed substrate W to a given temperature (e.g., 300 to 500° C.) The processing temperature is set appropriately depending on types of processing liquids applied to the substrate W. The lid 23 covers the hot plate 21. The lid 23 is movable in the upward/downward direction Z between a lowered position close to the hot plate 21 and a raised position spaced away from the hot plate 21. The lid 23 collects gases of the heat treatment atmosphere together with the sublimate generated from the coat film of the substrate W.

The baking unit BU discharges the exhaust gases through an exhaust pipe 24 in fluid communication with the lid 23. The lid 23 is in fluid communication with one end of an exhaust branch pipe 25. The exhaust branch pipe 25 includes another end in fluid communication with a first exhaust pipe 27. The exhaust branch pipes 25 of the five baking units BU that form the first bake group BG1 are each in fluid communication with the first exhaust pipe 27.

The first exhaust pipe 27 includes a collecting duct 29, a coupling part 31, a downward extension part 33, an underfloor extension part 35, and a junction 37. The exhaust pipe 27 forms an exhaust flow path for the exhaust gases from the first bake group BG1. The collecting duct 29, the coupling part 31, the downward extension part 33, the junction 37, and the underfloor extension part 35 are arranged side by side in this order downwardly in the upward/downward direction Z. The junction 37 is disposed at the midstream of the first exhaust pipe 27. Moreover, the collecting duct 29, the coupling part 31, the downward extension part 33, and the junction 37 are arranged in the upward/downward direction as a part of the first exhaust pipe 27. The underfloor extension part 35 is disposed to an underfloor of a clean room in a semiconductor plant. The underfloor extension part 35 is in fluid communication with an exhaust gas processor 41. The exhaust gas processor 41 is a device for processing the exhaust gases, and is a setup, for example, that is equipped by the semiconductor plant.

The collecting duct 29 has a side face where the second ends of the exhaust branch pipes 25 of the five baking units BU are in fluid communication. The collecting duct 29 includes a lower end in fluid communication with an upper portion of the coupling part 31. The coupling part 31 has a lower portion in fluid communication with an upper end of the downward extension part 33. The downward extension part 33 is formed by bent parts 33a to 33d for preventing interference with other elements not shown. The downward extension part 33 includes a lower end in fluid communication with an upper portion of the junction 37. The junction 37 includes a lower end in fluid communication with an upper portion of the underfloor extension part 35. The underfloor extension part 35 includes a hang-down part 35a that is directed downwardly from the junction 37 in the upward/downward direction Z, and a transverse extension part 35b that extends transversely from the hang-down part 35a in the backward direction XB.

As illustrated in FIG. 4, the downward extension part 33 includes the bend parts 33a to 33d that are formed at four positions. At these bent parts 33a to 33d, the center of exhaust gas flow contacts at obtuse angles. The hang-down part 35a and the hang-down part 35b of the underfloor extension part turn at the bent part 35c. The bent part 35c has a substantially right angle. The bent parts 33a to 33d have the obtuse angles, leading to smooth flow of the exhaust gases.

Similar to the first bake group BG1, the second bake group BG2 includes exhaust branch pipes 25 whose first ends are each in fluid communication with the lid 23. The exhaust branch pipes 25 of the second bake group BG2 include second ends in fluid communication with the second exhaust pipe 41.

The second exhaust pipe 41 includes a collecting duct 43, a coupling part 45, and a downward extension part 47. The collecting duct 43, the coupling part 45, and the downward extension part 47 are arranged in this order downwardly in the upward/downward direction Z. The second exhaust pipe 41 is shorter than the first exhaust pipe 27. More specifically, the downward extension part 47 of the second exhaust pipe 41 is shorter than the downward extension part 33 of the first exhaust pipe 27.

The collecting duct 43 has a side face where the second ends of the exhaust branch pipes 35 of the five baking units BU are in fluid communication. The collecting duct 43 includes a lower end in fluid communication with an upper portion of the coupling part 45. The coupling part 45 has a lower portion in fluid communication with an upper end of the downward extension part 47. The downward extension part 47 includes a lower end in fluid communication with the junction 37. As illustrated in FIG. 4, at the bent part 47a of the downward extension part 47, the center of exhaust gas flow contacts at a substantially right angle.

The substrate treating apparatus 1 configured in such a manner as above performs the following processing as under. That is, the exhaust gases discharged from the first bake group BG1 downwardly in the upward/downward direction Z flows through the first exhaust pipe 27. At the junction 37 on the midstream of the first exhaust pipe 27, the exhaust gases of the second bake group BG2 meet the gases from the second exhaust pipe 41, leading to suppressed reduction in temperature of the exhaust gases that flow in the first exhaust pipe 27. Accordingly, it is only necessary to provide the junction 37 at the midstream of the first exhaust pipe 27, leading to suppressed reduction in temperature of the exhaust gases with suppressed costs. As a result, suppressed deposition of the sublimate in the first exhaust pipe 27 and suppressed availability reduction of the substrate treating apparatus 1 is performable.

Moreover, the exhaust gases in the second bake group BG2 whose temperature is equal to or higher than the temperature of the exhaust gases in the first bake group BG1 meet at the junction 37. Accordingly, this achieves an increased temperature of the exhaust gases that is decreased to some extent through the first exhaust pipe 27.

Furthermore, a degree of decreasing the temperature of the exhaust gases from the second bake group BG2 before the junction 37 is smaller than a degree of decreasing the temperature of the exhaust gases from the first bake group BG1 that flows in the first exhaust pipe 27 that is shorter than the second exhaust pipe 41. Consequently, the exhaust gases from the second bake group BG2 whose degree of temperature decrease is small meet at the junction 37, leading to more suppressed reduction in temperature of the exhaust gases that flow in the first exhaust pipe 27.

Furthermore, the first exhaust pipe 27 is bent at the bent parts 33a to 33d of the downward extension part 33 at obtuse angles, leading smooth flow of the exhaust gases to the junction 37. Accordingly, this allows suppressed reduction in temperature of the exhaust gases during flowing down in the downward extension part 33 of the first exhaust pipe 27.

Now Inventors of the present invention perform temperature simulations to the conventional example where the exhaust pipes 24 are provided in both the first bake group BG and the second bake group BG2 and the embodiment described above. The requirement is to process the baking unit BU at a temperature of 300° C. In this case, in the conventional example, the hang-down part 35a has a temperature of 38° C. at the downstream end thereof. In contrast to this, the temperature becomes 80° C., and accordingly, significant improvement is obtained.

Now, the first exhaust pipe 27 and the second exhaust pipe 41 described above may be configured as under. Reference is now made to FIG. 5. FIG. 5 is one modification of the exhaust pipe.

The exhaust pipe 24A is identical to the above-described exhaust pipe 24 in the feature to include the first exhaust pipe 27 and the second exhaust pipe 41, but differs in fluid communication angle at the junction 37. Specifically, in the exhaust pipe 24A, the downward extension part 33 of the first exhaust pipe 27 is in fluid communication with a downward extension part 47 of the second exhaust pipe 41 at an acute angle relative to the center of exhaust gas flow in the downstream side of the junction 37A. Consequently, the exhaust gases in the first exhaust pipe 27 and the second exhaust pipe 41 are capable of flowing into the junction 37A smoothly. Accordingly, this achieves smooth exhaust gas flow downstream of the junction 37A, and thus suppressed reduction in temperature of the exhaust gases that flow down in the first exhaust pipe 27.

Moreover, the exhaust pipe 24A shown in FIG. 5 differs from the exhaust pipe 24 shown in FIG. 4 in configuration of the bent part 35c (FIG. 4) at the underfloor extension part 35 of the first exhaust pipe 27. Specifically, the exhaust pipe 24A is formed such that a bending radius R of a bent part 35c' (FIG. 5) is larger than a length L of the hang-down part 35a of the underfloor extension part 35. Accordingly, this achieves smooth exhaust gas flow, and thus suppressed reduction in temperature of the exhaust gases that flow down in the underfloor extension part 35 of the first exhaust pipe 27.

Now, the temperature simulation to the above modification made by Inventors of the present invention reveals that the modification achieves significant improvement that the downstream end of the hang-down part 35a has the temperature of 90° C.

The present invention is not limited to the foregoing examples, but may be modified as follows.

(1) In the embodiment described above, the baking unit BU of the second bake group BG2 performs treatment at a temperature equal to or higher than that in the baking unit BU of the first bake group BG1. However, such a requirement is not essential to the present invention. That is, when the temperature at which the sublimate is deposited in the exhaust pipe 24 is well-known as a deposition temperature, combination may be performed such that the temperature at the junction 37, 37A is higher than the deposition temperature and becomes higher up to the transverse extension part 35b.

(2) In the embodiments described above, the second exhaust pipe 41 is shorter than the first exhaust pipe 27. However, the present invention is not limitative to this configuration. That is, it is only necessary that the temperature of the exhaust gases at the junction 37 from the second exhaust pipe 41 is higher than that of the exhaust gases at the junction 37 from the first exhaust pipe 27. Accordingly, the present invention may adopt such a configuration that the second exhaust pipe 41 of the exhaust pipe 24, 24A is longer than the exhaust pipe 27 of the first exhaust pipe 27.

(3) In the embodiments described above, the bent parts 33a to 33d each have an obtuse angle. However, the present invention is not limitative to this configuration. Specifically, the angle may be a right angle or an acute angle when the sublimate is hard to be deposited in the bent parts 33a to 33d.

(4) In the embodiments described above, the exhaust pipe 24, 24A discharges the exhaust gases collected with the lid 23 of the baking unit BU. However, the present invention is not limitative to this configuration. For instance, it is also applicable that the exhaust gases are discharged laterally of the baking unit BU. Alternatively, it is also applicable that the exhaust gases are discharged from a clearance between the hot plate 21 and the lift pins.

(5) In the embodiments described above, the flow rate of the exhaust gases in the exhaust pipe 24, 24A is positively controlled. However, the present invention may include a flow rate regulator. This allows control of a flow rate ratio between the first bake group BG1 and the second bake group BG2, leading to a largely expected effect of suppressed reduction in temperature of the exhaust gases. Specifically, it is only necessary to provide a flow rate regulating valve on one or both of the coupling parts 31, 45. Preferably, in order to make it harder to prevent flow of the exhaust gases in the flow path for achieving difficulty in deposition of the sublimate, a fixed orifice having a fixed diameter of the flow path is attached.

(6) In the embodiments described above, the transverse extension part 35b of the exhaust pipe 24, 24A extends in the backward direction XB to be connected to the exhaust gas processor 41. However, the present invention is not limitative to this configuration. That is, such a configuration is adoptable that the transverse extension part 35b extends in either the forward/backward direction X or the width direction Y. Moreover, the underfloor extension part 35 is not necessarily disposed under the floor, but may be disposed on the floor.

(7) In the embodiments described above, the first bake group BG1 and the second bake group BG2 each include five baking units BU. However, the present invention is not limitative to this configuration. Specifically, the first bake group BG1 and the second bake group BG2 may each include two or more baking units BU. Moreover, the first bake group BG1 and the second bake group BG2 may include the numbers of baking units BU different from each other.

(8) In the embodiments described above, the exhaust gases from the first bake group BG1 are caused to meet the exhaust gases from the second bake group BG2. However, the present invention is not limitative to this configuration. For instance, when first to third bake group BG1 to BG3 are provided in the upward/downward direction Z, a plurality of second exhaust pipes may be disposed such that exhaust gases from the second bake group BG2 and the third bake group BG3 meet the first bake group BG1.

(9) In the embodiments described above, the first exhaust pipe 27 and the second exhaust pipe 41 are directed in the upward/downward direction. However, this is not limitative. For instance, when a plurality of baking units BU each having the first bake group BG1 and the second bake group BG2 are arranged in parallel in the transverse direction, the first exhaust pipe 27 and the second exhaust pipe 41 may be arranged in the transverse direction. That is, the first exhaust pipe 27 and the second exhaust pipe 41 may be directed in various manners appropriately depending on arrangement of the baking units BU that form the first bake group BG1 and the second baking unit BG2.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus with a baking unit for heating a substrate to which a treating liquid that generates sublimate through heating is applied to bake a surface of the substrate to form a coat film, the apparatus comprising:
    a first bake group formed by multiplying the baking unit in number to include a plurality of the baking units;
    a second bake group formed by multiplying the baking unit the baking unit in number to include a plurality of the baking units;
    a first exhaust pipe that forms a flow path of exhaust gases from the first bake group with its end being in fluid communication with an exhaust gas processor that processes the exhaust gases;
    a second exhaust pipe that forms a flow path of exhaust gases from the second bake group; and
    a junction provided at a midstream of the first exhaust pipe and in fluid communication with a downstream side of the second exhaust pipe,
    wherein the first exhaust pipe includes at least partially thereof a first part that is directed upwardly/downwardly, and
    the junction is disposed at a point along the first part of the first exhaust pipe directed upwardly/downwardly.

2. The substrate treating apparatus according to claim 1, wherein
    the baking units forming the second bake group each perform treatment at a temperature higher than that in the baking units of the first bake group.

3. The substrate treating apparatus according to claim 2, wherein
    the second exhaust pipe is shorter than the first exhaust pipe.

4. The substrate treating apparatus according to claim 2, wherein
    when the first exhaust pipe and the second exhaust pipe each include bent parts up to the junction, the bent parts each have an obtuse angle.

5. The substrate treating apparatus according to claim 2, wherein
    the baking unit includes a hot plate that heats the substrate placed thereon, and a lid above the hot plate, and
    the exhaust gases are collected with the lid.

6. The substrate treating apparatus according to claim 1, wherein
    the second exhaust pipe is shorter than the first exhaust pipe.

7. The substrate treating apparatus according to claim 6, wherein
when the first exhaust pipe and the second exhaust pipe each include bent parts up to the junction, the bent parts each have an obtuse angle.

8. The substrate treating apparatus according to claim 1, wherein
when the first exhaust pipe and the second exhaust pipe each include bent parts up to the junction, the bent parts each have an obtuse angle.

9. The substrate treating apparatus according to claim 1, wherein
the first exhaust pipe and the second exhaust pipe are in fluid communication with the junction at an acute angle relative to a center line of the exhaust gas flow at the junction.

10. The substrate treating apparatus according to claim 9, wherein
the first exhaust pipe includes a second part that extends transversely from the first part directed upwardly/downwardly at a downstream side of the first part, and
a bent part of the second part that extends transversely from the first part directed upwardly/downwardly has a radius longer than a length in a longitudinal direction of the first exhaust pipe downstream of the junction.

11. The substrate treating apparatus according to claim 1, wherein
the first exhaust pipe includes a second part that extends transversely from the first part directed upwardly/downwardly at a downstream side of the first part, and
a bent part of the second part that extends transversely from the first part directed upwardly/downwardly has a radius longer than a length in a longitudinal direction of the first exhaust pipe downstream of the junction.

12. The substrate treating apparatus according to claim 1, wherein
the baking unit includes a hot plate that heats the substrate placed thereon, and a lid above the hot plate, and
the exhaust gases are collected with the lid.

* * * * *